United States Patent [19]

Rice

[11] Patent Number: 4,459,605
[45] Date of Patent: Jul. 10, 1984

[54] VERTICAL MESFET WITH GUARDRING

[75] Inventor: Edward J. Rice, Los Gatos, Calif.

[73] Assignee: Acrian, Inc., Cupertino, Calif.

[21] Appl. No.: 371,598

[22] Filed: Apr. 26, 1982

[51] Int. Cl.³ .................................................. H01L 29/80
[52] U.S. Cl. .......................................... 357/22; 357/13; 357/15; 357/34; 357/56
[58] Field of Search ................ 357/34, 55, 56, 22, 357/15, 20

[56] References Cited

U.S. PATENT DOCUMENTS

| | | | |
|---|---|---|---|
| 3,244,555 | 4/1966 | Adam et al. | 357/56 |
| 3,541,403 | 11/1970 | Lepselter et al. | 357/15 |
| 3,764,865 | 10/1973 | Napoli et al. | 357/55 |
| 3,780,359 | 12/1973 | Dumke et al. | 357/34 |
| 4,326,209 | 4/1982 | Nishizawa | 357/22 |
| 4,343,015 | 8/1982 | Baliga et al. | 357/55 |

FOREIGN PATENT DOCUMENTS 1470014 4/1977 United Kingdom ............... 357/225

*Primary Examiner*—William D. Larkins
*Attorney, Agent, or Firm*—Flehr, Hohbach, Test, Albritton & Herbert

[57] ABSTRACT

A mesa type transistor structure is formed by using a metal mask in a semiconductor etching process whereby the mesa structure forms beneath the metal mask with the metal mask overhanging the sidewalls of the mesa. In a subsequent metal deposition step the overhanging metal layer provides a shadow mask which prevents the deposition of metal on a doped region in the mesa structure. A base contact in a bipolar structure or a gate contact in a field effect transistor structure abuts the mesa structure to provide enhanced device characteristics without shorting to the emitter or source region.

3 Claims, 10 Drawing Figures

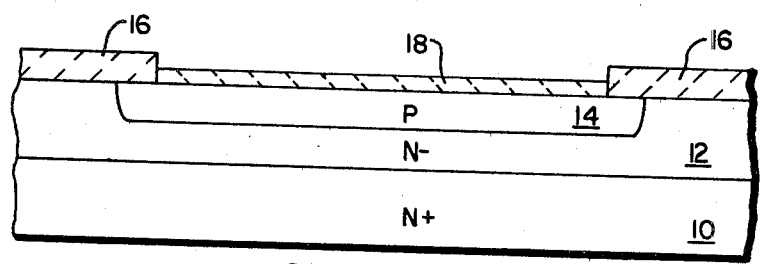
FIG.—1A
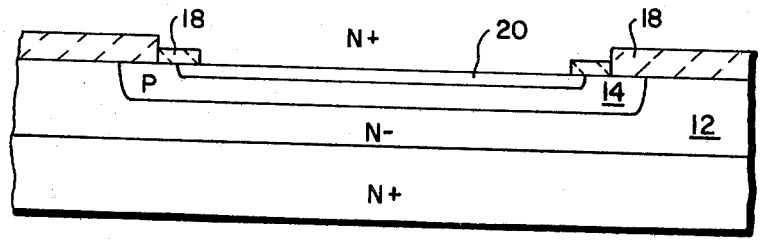
FIG.—1B
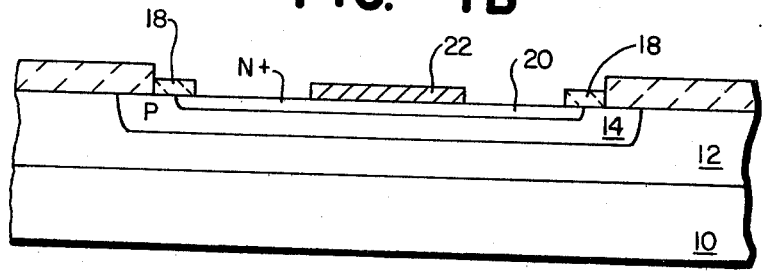
FIG.—1C
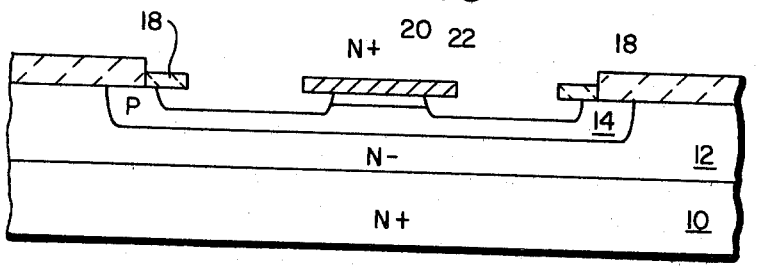
FIG.—1D
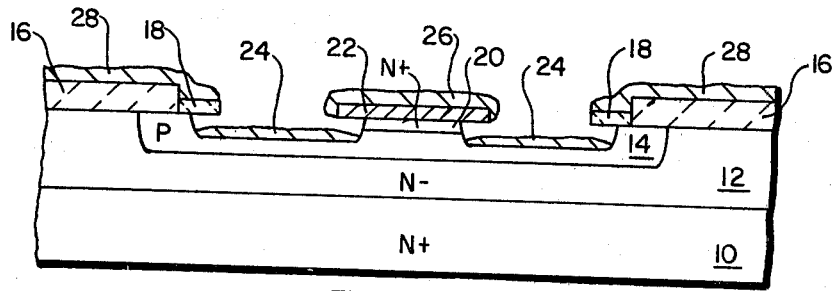
FIG.—1E

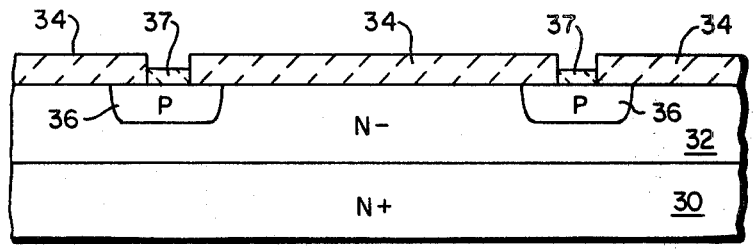
FIG.—2A
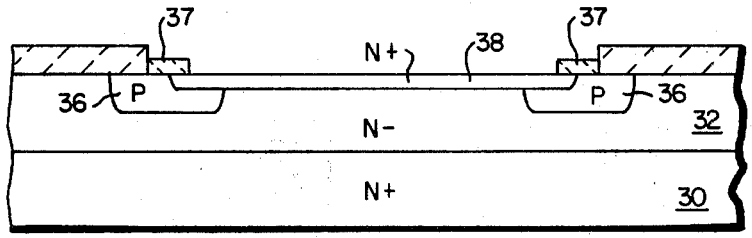
FIG.—2B
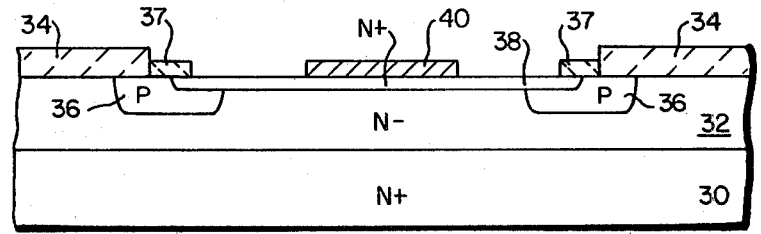
FIG.—2C
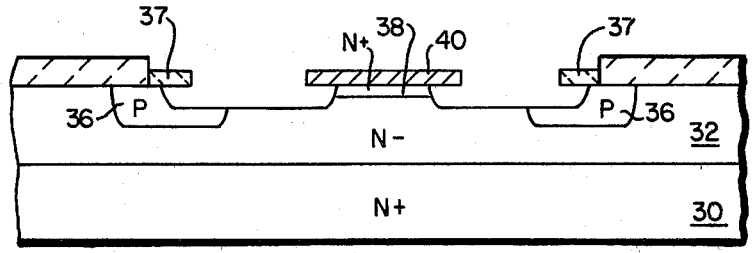
FIG.—2D
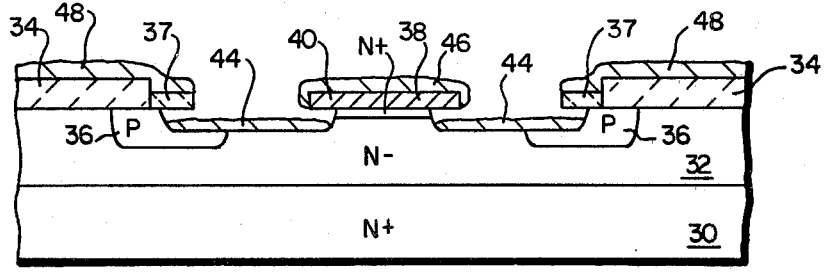
FIG.—2E

VERTICAL MESFET WITH GUARDRING

This invention relates generally to semiconductor devices and processes, and more particularly the invention relates to mesa structure bipolar and field effect transistors and methods of fabricating same.

The mesa transistor structure offers advantages over the planar transistor structure in high power and high frequency applications. In a bipolar transistor the semiconductor body comprises the collector element, the base comprises a portion of a mesa formed on a surface of the semiconductor body, and the emitter is formed in the mesa surface. Optimally, the base metal contact should be positioned as close to the emitter region as possible. Similarly, in a field effect transistor the gate metal should be provided on the mesa sidewalls to optimize the pinchoff region for maximum gain. However, heretofore the needed isolation of the emitter and base metal contacts has required a substantial spacing therebetween.

The present invention is directed to a method of making novel mesa structures using a unique combination of known processing techniques. Briefly, mesa structures having metal overhangs are provided with the overhanging metal portion functioning as a mask in the processing steps. A base contact in close proximity to the base-emitter junction is provided by depositing metal on the surface of the semiconductor body with the overhang shielding the base-emitter junction. Alternatively, a Schottky metal contact is provided in a field effect transistor structure which optimizes the pinchoff region in the mesa structure while retaining a high source-gate breakdown voltage.

The invention and objects and features thereof will be more readily apparent from the following detailed description and appended claims when taken with the drawing, in which:

FIGS. 1A–1E are section views of a portion of a semiconductor body illustrating the steps in fabricating a bipolar transistor structure in accordance with one embodiment of the invention.

FIGS. 2A–2E are section views of a portion of a semiconductor body illustrating steps in fabricating a Schottky barrier field effect transistor structure in accordance with another embodiment of the invention.

Referring now to the drawings, FIGS. 1A–1E illustrate steps in fabricating a bipolar transistor structure in accordance with the invention.

In FIG. 1A there is shown an N+ silicon substrate 10 and an N− epitaxial layer 12 with a P region 14 formed in a surface portion of layer 12 by the diffusion of a P type dopant such as boron through a silicon oxide mask 16 on the surface of the epitaxial layer 12. The substrate and epitaxial layer have a 1-0-0 surface crystallographic orientation which can be preferentially etched. A thin oxide layer 18 forms in the window of the silicon oxide mask 16 during the base diffusion. In an illustrative embodiment the substrate 10 has a dopant concentration of $10^{18}$ phosporous atoms per cubic centimeter, the epitaxial layer 12 has a dopant concentration of $10^{14}$–$10^{16}$ phosporous atoms per cubic centimeter, and the P region 14 has a dopant concentration on the order of $6 \times 10^{17}$ boron atoms per cubic centimeter.

Thereafter, as illustrated in FIG. 1B an opening is etched in the silicon oxide layer 18 and an N+ region 20 is formed in the P region 14 by the diffusion of an N type dopant such as phosporous. The surface concentration of the N+ region is on the order of $3 \times 10^{19}$ phosporous atoms per cubic centimeter.

Any oxide forming on the surface of the region 20 is removed, and a conductor layer 22 is then formed on the surface of region 20 which is spaced from the silicon oxide 18, as shown in FIG. 1C. The conductor layer may be aluminum, titanium-tungsten, molybedenum, or a metal silicide. The layer 22 is formed by masking and etching a surface layer of the metal. The layer 22 can be retained on the silicon oxide, if desired, or stripped therefrom as illustrated.

Thereafter, as shown in FIG. 1D an isotropic etchant such as a mixture of hydrofluoric acid and nitric acid is applied to the exposed surface of region 20 between oxide 18 and the conductor layer 22, and 1-2 microns of semiconductor material are removed. Conductor layer 22 is undercut approximately 1-2 microns, as shown. The isotropic etch is followed by an anisotropic etch by applying an etchant such as potassium hydroxide which preferentially attacks the 1-0-0 plane of the silicon surface thereby deepening the etched portion and forming generally planar inclined sidewalls on the mesa underneath the conductor layer 22 which are defined by the 1-1-1 crystalline plane of the semiconductor material. All of the exposed N+ material is removed by the preferential etchant.

Thereafter, the device is completed as shown in FIG. 1E by depositing metal on the structure thereby forming the base contact metal 24 on the etched surface. Metal 26 is deposited on the underlying emitter contact conductor 22, and metal 28 is formed over the field oxide 16, 18. Importantly, the overhanging conductor layer 22 provides a shadow mask whereby the metal 24 contacts the base portion of the mesa structure near the base-emitter junction, but is prevented from depositing on the junction or the emitter region 20. In the completed device the substrate 10 and epitaxial layer 12 comprise the collector region, the P region 14 is the base, and the N+ region 20 in the mesa is the emitter. The shadow mask facilitates isolation of the emitter and base metal and allows the base metal to abut the base portion of the mesa in close proximity to the emitter base junction. Further, the base contact metal has sufficient thickness to carry the base current.

FIGS. 2A–2E are section views of a portion of a semiconductor body illustrating the steps in fabricating a Schottky barrier field effect transistor in accordance with another embodiment of the invention. In FIG. 2A there is shown an N+ silicon substrate 30, an N− epitaxial layer 32 formed on a major surface of the substrate 30, an oxide mask 34 formed on the surface of the epitaxial layer 32, and a P type guard ring 36 formed by diffusing a P type dopant such as boron through the window in mask 34. Again, a thin oxide 36 is formed in the window of mask 34 during formation of the guard ring 36. It will be appreciated that the guard ring 36 is generally annular in configuration. In FIG. 2B a portion of the oxide 36 is removed and an N+ region 38 is formed by diffusing an N type dopant such as phosporous into the exposed surface of the epitaxial layer 32. Again, the dopant concentration of the substrate 30 is on the order of $10^{18}$ phosporous atoms per cubic centimeter and the N− epitaxial layer has a dopant concentration of $10^{14}$–$10^{16}$ phosporous atoms per cubic centimeter. The P type guard ring 36 has a dopant concentration of approximately $6 \times 10^{17}$ boron atoms per cubic centimeter, and the surface concentration of the N+ region 38 is on the order of $3 \times 10^{19}$ phosporous atoms per cubic centimeter.

Thereafter, as shown in FIG. 2C a conductor layer 40 is formed on the surface of the N+ region 38 by depositing a layer of suitable metal such as aluminum, titanium-tungsten, molybedenum, or a metal silicide on the surface and removing all but the layer 40 by photoresist masking and etching techniques. As shown in FIG. 2D an isotropic etchant is then applied to the exposed surface of region 38 between the conductor layer 40 and the silicon oxide 36 to remove 1-2 microns of semiconductor material. The isotropic etch undercuts the silicon oxide 37 and metal layer 40 by 1-2 microns, also. Thereafter, an anistropic etchant is applied to increase the depth of the etched region by an additional 1-2 micron and removing all of the exposed N+ material. The preferential etchant removes less silicon material on the 1-1-1 crystal orientation of the mesa sidewalls.

The Schottky barrier field effect transistor is completed as shown in FIG. 2E by depositing metal such as aluminum thereby forming a Schottky metal contact 44 on the suriace of the N− region 32 including the bottom portion of the mesa structure underlying the metal layer 40. Metal 46 is deposited on the conductor layer 40, but the overhanging layer 40 provides a shadow mask which prevents metal from depositing on the N+ source region 38 underlying layer 40. Additional metal 48 forms on the surface of the field oxide 34. The shadow mask provided by the overhang of layer 40 isolates the source and gate metal contacts yet optimizes the pinchoff region of the field effect transistor between the source 38 and the drain region 30, 32, by allowing the gate metal 44 to abut the mesa structure under the metal layer 40. Gain and current handling capability of the field effect transistor is maximized and the source-gate breakdown voltage remains high.

There has been described improved bipolar and field effect mesa transistor structures resulting from using a conductor shadow mask formed by isotropic and anisotropic etching techniques. The devices have enhanced current carrying capacity while maintaining electrical isolation between metal contacts to the structures.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor field effect transistor structure comprising
    a semiconductor body having a first doped region of first conductivity type abutting a major surface of said body,
    a second doped region of first conductivity type formed in said first region and abutting said major surface,
    a conductor layer on the surface of said second doped region, said second doped region and a portion of said first doped region forming a mesa structure under said conductor layer with said conductor layer overhanging at least a portion of the sidewalls of said mesa structure,
    a metal layer on the surface of said first doped layer and abutting the sidewalls of said mesa structure but spaced from said second doped region, said metal layer forming a Schottky junction with said first region, and
    a doped region of opposite conductivity type formed in said first region abutting said major surface and surrounding said second doped region.

2. The semiconductor structure as defined by claim 1 wherein said semiconductor body comprises a substrate of said first conductivity type, an epitaxial layer of said first conductivity type, said first region comprising part of said epitaxial layer.

3. The semiconductor structure as defined by claim 2 wherein said conductor layer is selected from the group consisting of aluminum, titanium-tungsten, molybdenum, and a metal silicide.

* * * * *